United States Patent [19]
Ross

[11] 3,995,212
[45] Nov. 30, 1976

[54] APPARATUS AND METHOD FOR SENSING A LIQUID WITH A SINGLE WIRE TRANSMISSION LINE

[75] Inventor: Gerald F. Ross, Lexington, Mass.
[73] Assignee: Sperry Rand Corporation, New York, N.Y.
[22] Filed: Apr. 14, 1975
[21] Appl. No.: 567,581

[52] U.S. Cl. .......................... 324/58.5 B; 73/290 R; 73/304 R
[51] Int. Cl.² .................. G01F 23/28; G01R 27/06
[58] Field of Search .......... 73/290 R, 290 V, 304 R; 324/58 A, 58 B, 58.5 R, 58.5 B, 185, 187, 188; 333/955

[56] References Cited
UNITED STATES PATENTS

| | | | |
|---|---|---|---|
| 2,685,068 | 7/1954 | Goubau | 333/95 S |
| 3,079,551 | 2/1963 | Walker | 333/95 S X |
| 3,218,553 | 11/1965 | Peterson et al. | 324/187 |
| 3,474,337 | 10/1969 | Petrick | 73/304 R X |
| 3,753,111 | 8/1973 | Denbnovetsky et al. | 324/187 |
| 3,812,422 | 5/1974 | De Carolis | 324/58.5 B |
| 3,832,900 | 9/1974 | Ross | 73/290 R |

Primary Examiner—Richard C. Queisser
Assistant Examiner—Frederick Shoon
Attorney, Agent, or Firm—Howard P. Terry; Seymour Levine

[57] ABSTRACT

A method and apparatus for measuring the level and dielectric constant of a liquid which includes a device for generating a subnanosecond baseband pulse that propagates through a transition device to a single wire transmission line that extends through an air filled region into the liquid. A discontinuity created at the air liquid interface produces a reflection of the baseband pulse that is compared with the transmitted pulse with respect to time of arrival and amplitude to determine the liquid level and the reflection coefficient at the air liquid interface. The reflection coefficient is then utilized to determine the dielectric constant of the liquid.

10 Claims, 4 Drawing Figures

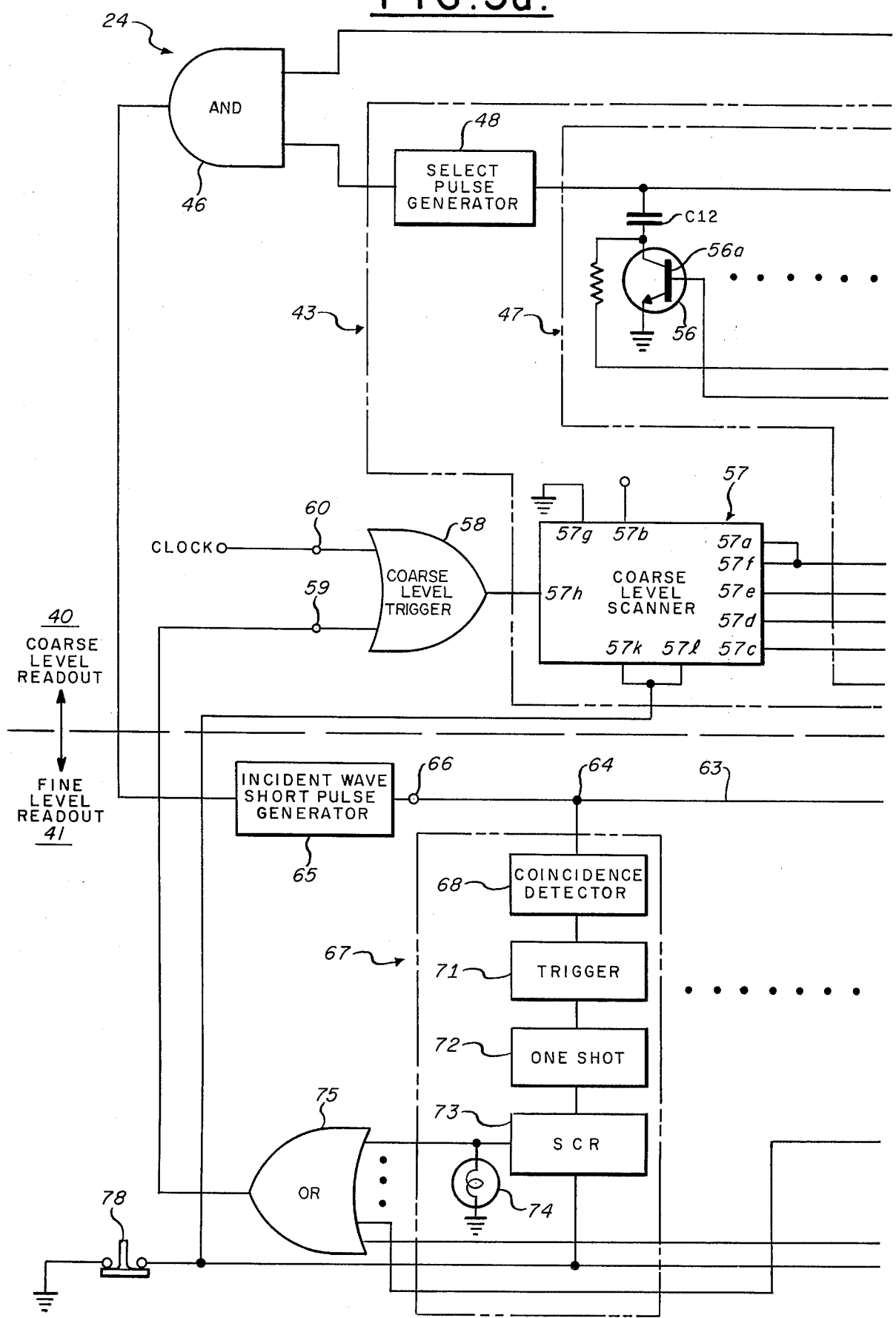

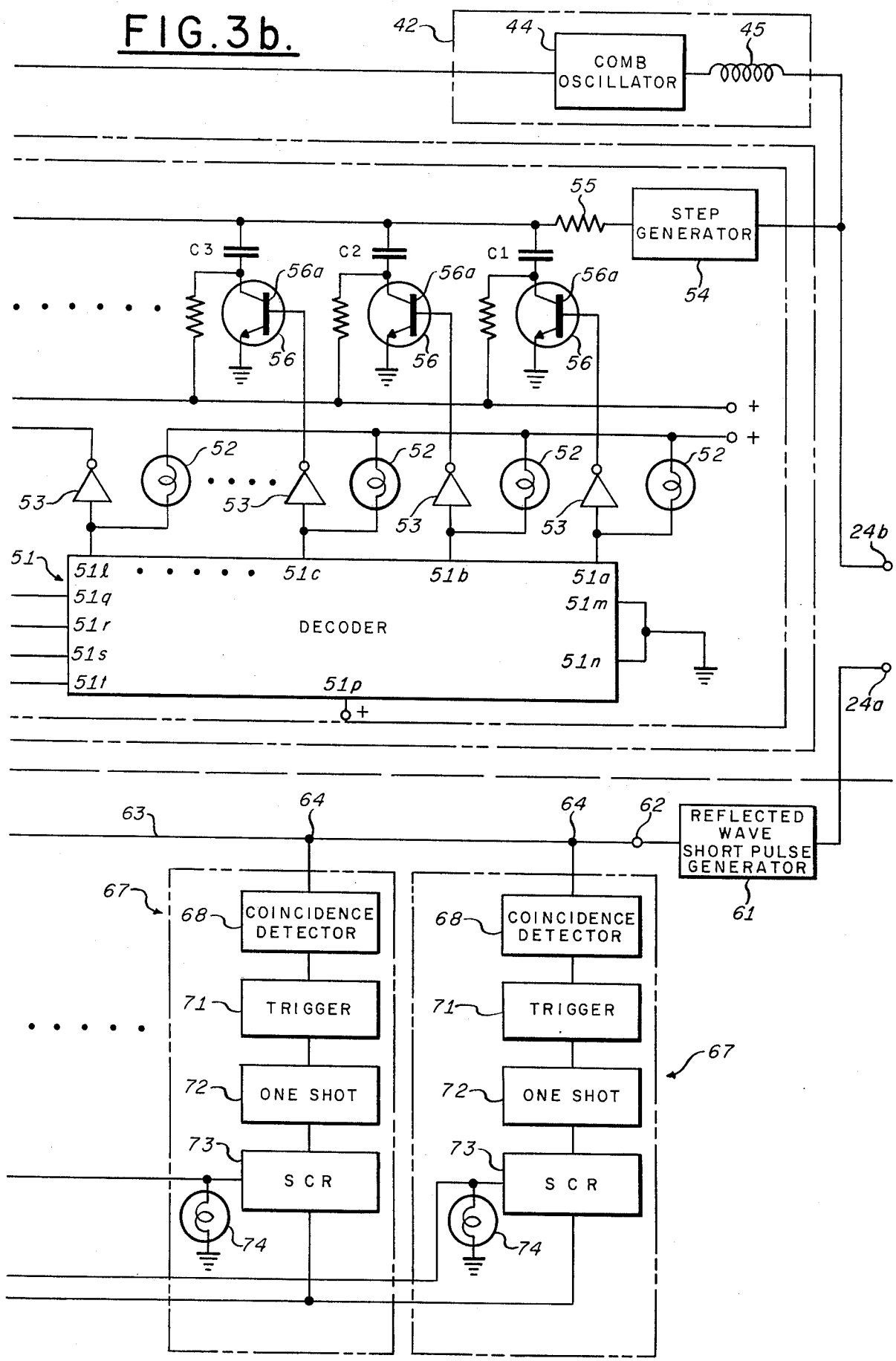

APPARATUS AND METHOD FOR SENSING A LIQUID WITH A SINGLE WIRE TRANSMISSION LINE

BACKGROUND OF THE INVENTION

1. Field of the Invention

This invention pertains to a method and apparatus for determining the level and dielectric constant of a liquid.

2. Description of the Prior Art

Various mechanical, electromechanical and sonic techniques have been employed to measure the level of a liquid or the interface levels between two or more liquids. The mechanical and electromechanical systems are relatively slow in reacting to changes in the level of the liquid while systems employing sonic or ultrasonic transmissions become complex when used to measure the surface levels of contained liquids because of echoes received from the surfaces forming the sides of the container.

Most prior art radiation reflection detection systems, while providing highly accurate indications of liquid level and responding in extremely short times to changes in the levels of the contained liquids, require very complex and expensive apparatus in order to function properly. A prior art system which minimizes this complexity and still provides the advantages of a radiation reflection detection scheme is disclosed in U.S. Pat. No. 3,832,900 issued Sept. 3, 1974 to the present inventor and assigned to the Sperry Rand Corporation. This invention utilizes an open coaxial line which is immersed in the contained liquid, the contained liquid thereby filling the coaxial line. The liquid surface creates a discontinuity in the coaxial line which produces a reflection of the baseband pulse signal that propagates back along the transmission line. The time at which this reflection is received, relative to the time of the transmitted pulse, determines the level of liquid. However, the transmission line tends to clog and requires frequent cleaning. The subject invention provides a method and apparatus for measuring the level of a liquid which eliminates the clogging problem, provides highly accurate level indications without the complexity of the prior art radiation reflection detection systems and determines the dielectric constant of the liquid.

SUMMARY OF THE INVENTION

The subject invention provides an apparatus and method with which the level and type of a contained liquid may be determined. A pulse generator produces a probe pulse, that is a baseband pulse of subnanosecond duration, which is coupled to a transition device through a directional coupler. The transition device converts the transmission line guiding the probe pulse into a single wire transmission along which the wave continues to propagate. The wire is positioned perpendicularly to the surface of the liquid and extends therethrough. Reflections of the probe pulse, caused by the change in dielectric constant at the surface of the liquid, are propagated back along the wire towards the transition and coupled to the directional coupler. Samples of the reflected wave are coupled to the reflection port of the directional coupler which also possesses a port at which samples of the incident waves appear. These ports are coupled through a switch to a level processor in which the delay between the incident and reflected waves is determined. This delay is utilized to determine the liquid level.

The level processor contains two inputs, one of which is coupled to an increment generator and a function generator, both of which are triggered by the sampled incident wave from the directional coupler which is also coupled to this port. The increment generator provides a series of very short pulses, the period of which when multiplied by the velocity of light, is equal to a coarse level increment within which the final level determination is to be made. The coarse level increment selector provides a pulse, the width of which is greater than the width of the pulses generated by the increment generator, which represent a given coarse range increment. Only one selector pulse is generated for each probe pulse transmitted, each selector pulse representing a different coarse level increment. The selector pulse and the train of pulses from the increment generator are fed to an AND gate which provides an output when one of the pulses from the increment generator is in time coincidence with the selector pulse. The output of the gate triggers an incident wave short pulse generator, the output pulse of which is coupled to one end of a transmission line, the other end of which is coupled to a reflected wave short pulse generator, that is also coupled to the second input of the level processor and is triggered by the sampled reflected wave. When the two pulses propagating on the transmission line coalesce, the fine level is determined within the given coarse level and a lockup pulse is transmitted to the coarse level readout thereby locking the entire system.

When the liquid level is determined, the outputs of the directional coupler are switched to the liquid identification processor which also contains two inputs. The first input is coupled to the sampled incident wave and the second input is coupled to the sampled reflected wave. If the liquid is lossless, the ratio of the magnitude of the sampled reflected signal to the magnitude of the sampled incident signal is the reflection coefficient, $\Gamma$, at the surface of the liquid. Since $\Gamma$ is defined as:

$$\Gamma = \frac{Z - Z_0}{Z + Z_0}$$

where $Z_0$, the wave impedance in the air region above the liquid, is proportional to $$\frac{1}{\epsilon_0}$$

($\epsilon_0$ being the dielectric constant of free space) and Z, the wave impedance in the liquid region, is proportional to $$\frac{1}{\epsilon}$$

($\epsilon$ being the dielectric constant of the liquid). Consequently:

$$\epsilon_r = \frac{\epsilon}{\epsilon_0} = \left(\frac{1-\Gamma}{1+\Gamma}\right)^2$$

where $\epsilon_r$, the relative dielectric constant, identifies the liquid.

Circuitry for determining the various ratios in performing the indicated computations may be contained within the liquid identification processor or the processor may detect the amplitudes of the reflected and incident signals from which the above computations can be performed.

BRIEF DESCRIPTION OF THE DRAWINGS

FIG. 3 is a schematic diagram, partially in block form, of the liquid level processor.

DESCRIPTION OF THE PREFERRED EMBODIMENT

Figure 1:
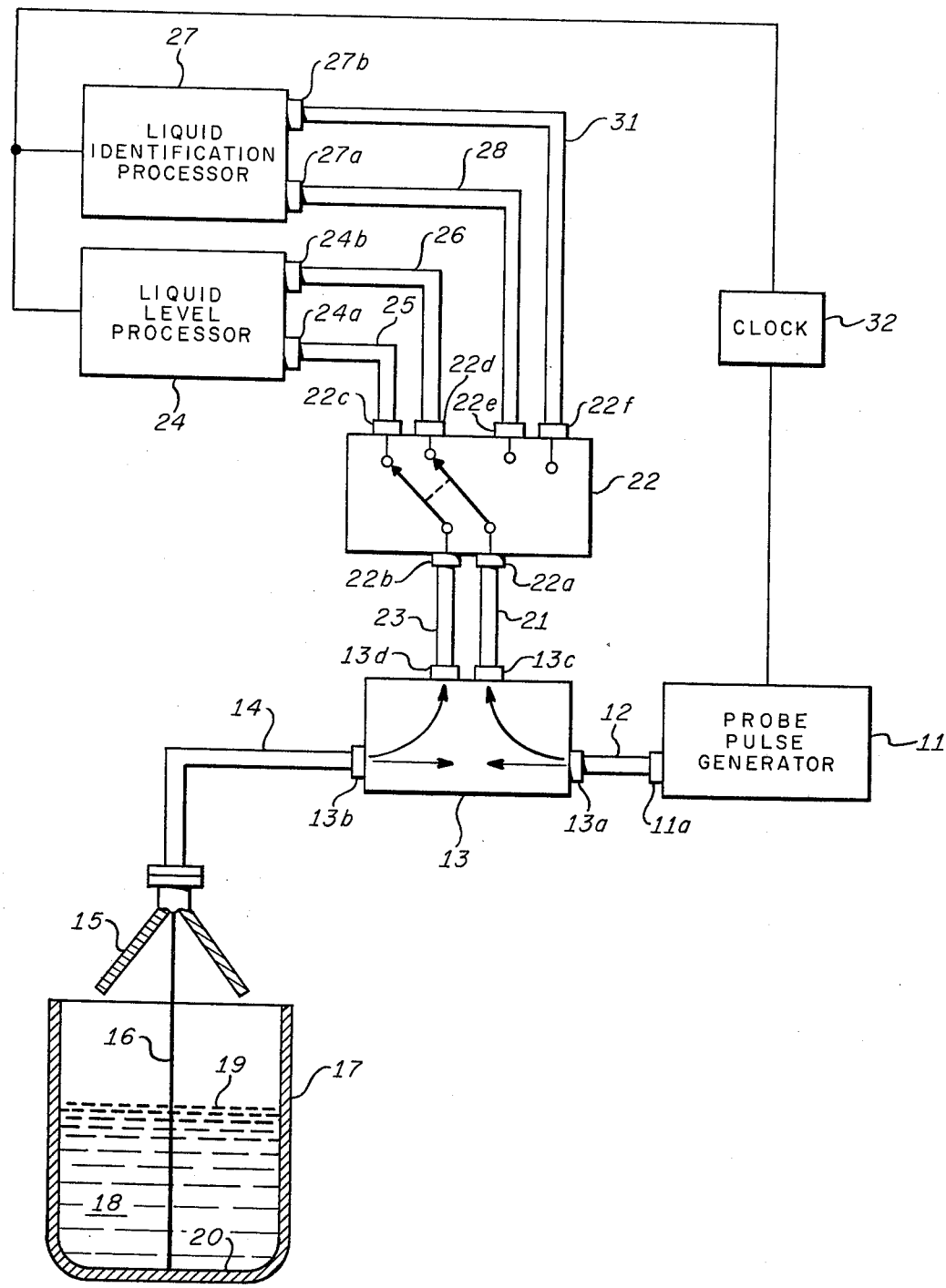
FIG. 1 is a block diagram of one configuration of the apparatus.

In FIG. 1, an apparatus 10 for sensing a liquid includes a probe pulse generator 11 having a terminal 11a connected through a transmission line 12 to port 13a of a directional coupler 13. The directional coupler 13 is biconjugate in a real time sense and is of a type generally known in the art. Directional couplers of this type couple signals at port 13a to ports 13b and 13c, while signals at port 13b couple to ports 13a and 13d. Port 13b on the directional coupler 13 is connected through transmission line 14 to a transition device 15. The transition device 15 converts a coaxial line to a signal wire transmission line 16 which is positioned in the container 17 extending in a substantially perpendicular direction to the surface of a fluid 18 therein and continues therethrough. Efficient excitation and undisturbed propagation through the transition may be accomplished by selecting the length and taper of the conical horn and by coating the surface of the inner conductor and its wire extension, which are of a selected diameter, with a dielectric material or by providing some other modification such as threading the surface of the inner conductor and its wire extension.

Port 13c of the directional coupler 13 is connected through a transmission line 21 to a port 22a of switch 22 and port 13d of directional coupler 13 is connected through transmission line 23 to port 22b of switch 22. Port 22c of switch 22 is connected to terminal 24a of a liquid level processor 24 via transmission line 25 and port 22d of switch 22 is connected to terminal 24b of the liquid level processor 24 via transmission line 26. Port 22b of switch 22 is connected to terminal 27a of liquid identification processor 27 via transmission line 28 and port 22f of switch 22 is connected to terminal 27b of liquid level processor 27 via transmission line 31. A clock 32 is coupled to probe pulse generator 11, liquid level processor 24 and liquid identification processor 27.

In FIG. 1, switch 22 may assume one of two positions. In the first position port 13d of directional coupler 13 is coupled to terminal 24a of liquid level processor 24 via transmission line 23, port 22b of switch 22, port 22c of switch 22 and transmission line 25, while port 13c of directional coupler 13 is coupled to terminal 24b of the liquid level processor 24 via transmission line 21, port 22a of switch 22, port 22d of switch 22 and transmission line 26. In the second position port 13d of directional coupler 13 is coupled to terminal 27a of liquid identification processor 27 via transmission line 23, port 22b of switch 22, port 22e of switch 22 and transmission line 28, while port 13c of directional coupler 13 is coupled to terminal 27b of the liquid identification processor 27 via transmission line 21, port 22a of switch 22, port 22f of switch 22 and transmission line 31.

The probe pulse generator 11 may be of the type generally known in the art. For example, a variety of pulse generators for producing single positive or negative going pulses having a very short duration are well known in the art. Two such devices for producing very short electromagnetic pulses are disclosed by U. C. McGuire in U.S. Pat. No. 3,553,499 entitled "Fast Acting Avalanche Mode Transistor Switch", issued Jan. 5, 1971 and assigned to the same assignee as the present invention and by G. F. Ross in U.S. Pat. No. 3,402,370 entitled "Pulse Generator", issued Sept. 17, 1968 and assigned to the United States of America as represented by the Secretary of the Air Force. The pulse generator described in U.S. Pat. No. 3,402,370 provides pulses having durations of small fractions of a nanosecond.

In FIG. 1 a clock 32 triggers the probe pulse generator 11 which produces a subnanosecond pulse at terminal 11a that propagates along transmission line 12 to terminal 13a of the directional coupler 13. The signal propagates through directional coupler 13 and appears at terminal 13b with essentially the same amplitude as the signal at terminal 13a. A portion of the signal at terminal 13a is coupled to port 13c. The amplitude of the signal at port 13c may be 20 db below the amplitude of the signal at 13a. Though essentially a zero db coupling between ports 13a and 13b and 20 db coupling between 13a and 13c is recited, the coupling between ports may take on various values for proper operation of the system. The signal at port 13b of the directional coupler 13 propagates along transmission line 14 to transition device 15 where it is coupled into container 17 via wire transmission line 16. A reflection is created at the surface of liquid 18 due to the discontinuity created by the air liquid interface. This reflection propagates back along wire 16 to the transition device 15, through the transmission line 14 to port 13b of the directional coupler 13 where it is coupled to port 13d with an amplitude that is 20 db below the amplitude at port 13b. With switch 22 in the first position, the signal at port 13d of directional coupler 13 is coupled to terminal 24a of liquid level processor 24 via transmission line 23, port 22b and 22c of switch 22, transmission line 25 while the signal at port 13c, of the directional coupler 13, is coupled to terminal 24b of the liquid level processor 24 via transmission line 21, ports 22a and 22d of switch 22 and transmission line 31. Liquid level processor 24 determines the time delay between the sampled incident signal at port 13c of directional coupler 13 and the sampled reflected signal at port 13d of directional coupler 13 from which the surface level 19 of liquid 18 may be established.

With the switch 22 in position 2, the incident signal at port 13c of directional coupler 13 is coupled to terminal 27b of liquid identification processor 27 via transmission line 21, ports 22a and 22f of switch 22 and transmission line 31, while the reflected signal at port 13d of directional coupler 13 is coupled to terminal 27a of liquid identification processor 27 via ports 22b and 22e of switch 22 and transmission line 28. The relative amplitudes of the incident and reflected signals is determined in the liquid identification processor 27. The ratio of the reflected signal to the incident signal determines the reflection coefficient at the surface level 19 from which the dielectric constant of liquid 18 is determined which, in turn, identifies the type of liquid. The liquid identification processor 27 may be a dual channel oscilloscope for which port 27b is the input to one channel and port 27a is the input to the other channel. The amplitudes indicated on the face of the oscilloscope are proportional to the incident and reflected waves from which the reflection coefficient can be determined.

Figure 2:
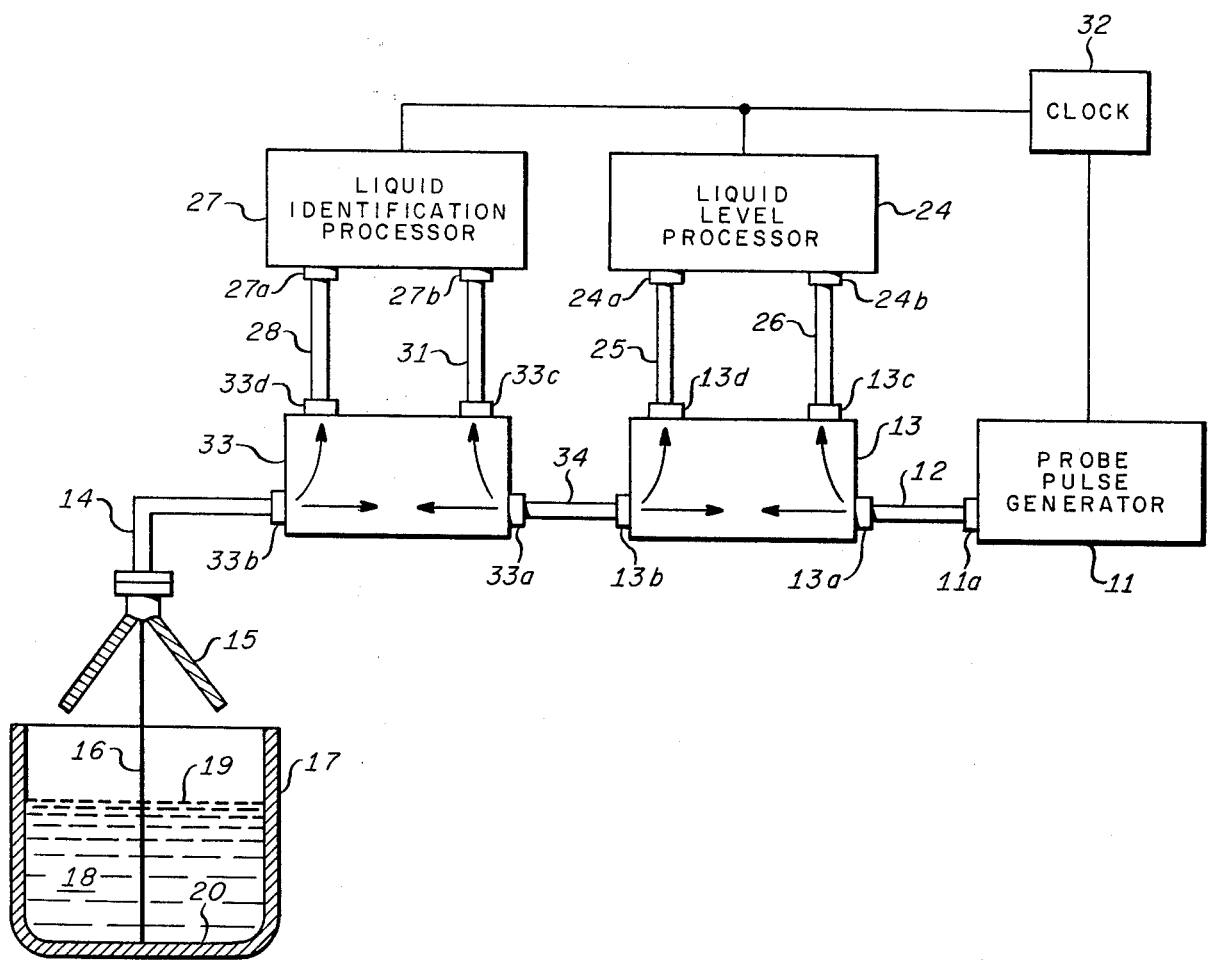
FIG. 2 is a block diagram of another configuration of the apparatus.

Another configuration of the apparatus 35 is shown in FIG. 2. In FIG. 2, port 11a of probe pulse generator 11 is coupled to port 13a of directional coupler 13, port 13c of directional coupler 13 is coupled to terminal 24b of the liquid level processor 24 via transmission line 26. Port 13b of directional coupler 13 is coupled to port 33a of directional coupler 33 via transmission line 34 and port 13d is coupled to terminal 24a of liquid level processor 24 via transmission line 25. Port 33c of directional coupler 33 is coupled to terminal 27b of the liquid identification processor 27 via transmission line 31 and port 33b is coupled to the transition device 15 via transmission line 14. Port 33d of directional coupler 33 is coupled to terminal 27a of liquid identification processor 27 via transmission line 28. The directional couplers 13 and 33 are similar with the ports 13a–d of directional coupler 13 corresponding with ports 33a–d of directional coupler 33.

Clock 32 triggers probe pulse generator 11 which produces a subnanosecond pulse at port 11a that propagates along transmission line 12 to port 13a of directional coupler 13. Clock 32 also provides a synchronization pulse to liquid identification processor 27 and a pulse to liquid level processor 24, the purpose of which will be discussed subsequently. Two pulses, the first possessing a level 20 $db$ below the second, are transmitted from ports 13c and 13b respectively. The signal at port 13c representing the incident wave is transmitted via transmission line 26 to terminal 24b of the liquid level processor 24. The signal at port 13b, which is the incident signal is transmitted along transmission line 34 to port 33a of directional coupler 33. Two signals, the first 20 $db$ below the second, are transmitted from ports 33c and 33b respectively. The signal at port 33c, representative of the incident wave, is transmitted along transmission line 31 to terminal 27b of liquid identification processor 27. The second signal which is the incident wave is transmitted from port 33b and propagates along transmission line 14 to the transition device 15. Reflected signals from the liquid surface level 19 propagate along wire 16, are received by the transition device 15 and propagate along transmission line 14 to port 33b of directional coupler 33. Two signals are transmitted from directional coupler 33 as a result of the reception of the reflected signal at port 33b. The first 20 $db$ below the second is transmitted from port 33d and propagates along transmission line 28 to terminal 27a of liquid identification processor 27. The second which is essentially at the same level of the reflected signal at port 33b is transmitted from port 33a and propagates along transmission line 34 to port 13b of directional coupler 13. The signals at ports 33c and 33d of the directional coupler 33, the first at port 33c representative of the incident signal and the second at port 33d representative of the reflected signal are processed by the liquid identification processor 27 to determine the reflection coefficient at the liquid surface level 19. The reflected signal at port 13b of directional coupler 13 is coupled to port 13d of directional coupler 13 with a −20 $db$ coupling coefficient and propagates along transmission line 25 to terminal 24a of the liquid level processor 24. The signal at port 13c of the directional coupler 13, which is representative of the incident wave, and the signal at port 13d of directional coupler 13, which is representative of the reflected wave, are processed in the liquid level processor 24 to determine the time delay between the incident and reflected waves from which the liquid level 19 may be determined.

The liquid level processor 24, which comprises a coarse level readout 40 and a fine level readout 41, is shown in detail in the schematic diagram of FIG. 3. In the coarse level readout 40, terminal 24b on the liquid level processor 24 is connected to an increment generator 42 and an increment selector 43. The increment generator includes a comb oscillator 44 coupled to terminal 24b through a delay circuit 45, the output of which is coupled to gate 46. The delay circuit is chosen to compensate for apparatus internal delays and may be a conventional delay line well known in the art. The increment selector 43 comprises a function generator 47 which is connected to terminal 24b on the liquid level processor 24 and a select pulse generator 48 which is connected to the function generator 47, the output of which is connected to the AND gate 46.

The function generator 47 may include a decoder 51 which may be a Texas Instruments SN74154, a cross range indicator which may be 12 lamps 52, an inverter 53 which is conventional and well known in the art and a select pulse timer which may include the combination of step generator 54, resistor 55, 12 transistors 56, each of which may be an avalanche transistor, and 12 capacitors $c-1$ through $c-12$. The transistors 56 provide a switch through which one side of one of the capacitors is grounded thereby forming a ramp function generator with the combination step generator 54, resistor 55 and the grounded capacitor. Terminals $51a-51i$ of decoder 51 correspond to terminals 1–11 and terminals $51j-5$- correspond to terminals 13–15 of the 74154 while terminals $51q-51t$ of decoder 51 correspond to terminals 20–23 of the 74154. Terminals $51m$ and $51n$, which are grounded, correspond to terminals 18 and 19 and terminal $51p$ which is coupled to a positive d.c. source (not shown) corresponds to terminal 24 of the 74154. Step generator 54 is connected to terminal 24b on liquid level processor 24 and connects to one end of resistor 55. The other end of resistor 55 is connected to one side of each of the capacitors $c-1$ through $c-12$ and to select pulse generator 48. The other side of each of the capacitors $c-1$ through $c-12$ each is connected to a transistor 56, the base 56a of which is coupled to one of the terminals $51a$–L via inverter 53. One end of each of the lamps 52 is connected to one of the terminals $51a-51L$ of decoder 51 and the other end of the lamps are all connected to a positive d.c. source not shown.

Coarse level scanner 57, having terminals $57a$ through $57h$, $57k$ and $57l$, may be a Texas Instruments SN 7492. Terminal $57a$ corresponds to terminal 1 of the 7492, terminal $57b$ which is coupled to a positive d.c. source (not shown), corresponds to terminal 5, while terminals $57c$, $d$, $e$ and $f$ correspond to terminals 8, 9, 11 and 12 of the 7492 respectively. Terminals $57k$ and $57L$, which are connected together and are coupled to ground via reset mechanism 78, correspond to terminals 6 and 7 of the 7492 and terminal $57h$ which is the input to the coarse level scanner 57 corresponds to terminal 14. Terminals $57f$ and $57a$ of coarse level scanner 57 are connected to terminal $51q$ of decoder 51, terminals 57e, 57d, 57c of coarse level scanner 57 are connected to terminals 51r, 51s, 51t of decoder 51 respectively and terminal 57h is coupled to coarse/level trigger 58.

Fine level readout 41 may include a reflected wave short pulse generator 61 connected to terminal 24a on liquid level processor 24 with an output terminal 62. A transmission line 63, which is divided into sixty equal segments that are equal to one electrical inch (2.54 centimeters) by sixty-one taps 64, is coupled to terminal 62 of reflected wave short pulse generator 61 at one end and at the other end to terminal 66 of an incident wave short pulse generator 65, which in turn is coupled to AND gate 46. Coupled to each tap 64 is fine level module 67 that includes: coincidence detector 68 connected to tap 64, trigger 71 connected to coincidence detector 68, one shot 72 connected to trigger 71, silicon control rectifier 73, connected to one shot 72 and coupled to reset mechanism 76, lamp 74, and OR gate 75. The output of OR gate 75 couples to one input of coarse level trigger 58, the other input of which is coupled to the clock 32 of FIG. 1.

The pulse representative of the incident pulse which appears at port 24b on liquid level processor 24 triggers step generator 54, which generates a step voltage, and comb oscillator 44, which generates a train of subnanosecond pulses, each separated by 10 nanoseconds corresponding to a coarse level increment of five feet (1.524m). Coarse level trigger 58 may be an OR gate of conventional design having input terminals 59 and 60 with the clock 32 of FIG. 1 coupled to terminal 60. An OR gate provides a high level signal at its output terminal whenever a high level signal is coupled to any one or all of its input terminals. Therefore, a high level signal exists at the output terminal of the coarse level trigger 58 for the duration of a high level signal coupled to the input terminal 59, irrespective of the signal level coupled to the input terminal 60 by the clock 32. When a high level signal is coupled to the input terminal 59, the output terminal of the coarse level trigger is locked at a high signal level for the duration of this signal and the coarse level scanner 57 cannot be stepped by the clock 32, thus preventing the coarse level scanner 57 from altering the code transmitted to the decoder 51. In the absence of a signal at the input terminal 59, of coarse level trigger 58, clock 32 of FIG. 1, which is coupled to the input terminal 60 of coarse level trigger 58, causes coarse level trigger 58 to provide a pulse at terminal 57h of coarse level scanner 57 which, in turn, generates a code to decoder 51 causing one of the transistors 56 to conduct, thereby grounding one of the capacitors $c$-1 through $c$-12 and lighting the light 52 which is connected to the terminal corresponding to the selected transistor 56. The output of the step generator 54 is integrated by the series combination of R55 and the grounded capacitor, resulting in a ramp waveform, which upon reaching a prescribed threshold level, triggers select pulse generator 48 thereby providing a five nanosecond pulse. The time delay between the triggering of the step generator 54 and the time that the ramp junction achieves the prescribed threshold level is determined by the value of the grounded capacitor. Values for each of the capacitors $c1$–$c12$ are selected to provide a difference in time delay generated by succeeding capacitors to be equal to one coarse level increment. Consequently, the combination of resistor 55, capacitors $c1$–$c12$ and transistors 56 which are excited one at a time and only one for each pulse of clock 32 of FIG. 1, comprise a ramp function selector that performs a depth scanning function. When one of the pulses generated by select pulse generator 48 straddles one of the subnanosecond pulses generated by comb oscillator 44, a pulse is produced at the output of AND gate 46 which, in turn, triggers incident wave short pulse generator 65, producing a subnanosecond pulse with amplitude $V_1$ at terminal 66 that proceeds to propagate along transmission line 63, the electrical length of which is equal to one coarse level increment and which contains a multiplicity of taps 64 with electrical spacing therebetween equal to a fine level increment.

The pulse at port 24a on liquid level processor 24 triggers reflected wave short pulse generator 61 producing a subnanosecond pulse with amplitude $V_2$ at terminal 62 that also proceeds to propagate along transmission line 63. When the two pulses coalesce at one of the taps 64 a pulse with amplitude $V_1 + V_2$ is produced. This pulse is coupled to the coincidence detector 68 which may include a diode biased to a threshold voltage $V_t$ such that $V_1 + V_2/2$
$< V_t < V_1 + V_2$, $V_1 < V_t$, and $V_2 < V_t$.

Thus the diode is non-conducting until the two pulses coalesce. When the diode conducts it provides a pulse to active trigger 71. Trigger 71 may include a tunnel diode or an avalanche transistor. For the rapidity of operation required when fine level increments of one inch are desired, the faster acting tunnel diode is preferred. Trigger 71 triggers a one shot 72 which, in turn, activates a silicon control rectifier 73. The output of the silicon control rectifier 73 lights lamp 74 indicating the fine level increment measured and causes the output of OR gate 75, which is coupled to input terminal 59 of coarse level trigger 58, to provide a positive signal to coarse level trigger 58 thus locking the apparatus. After a measurement has been made the liquid level processor is reset via reset mechanism 78 removing silicon control rectifier 73 and terminals 57k and 57L of coarse level scanner 57 from ground.

While the invention has been described in its preferred embodiment, it is to be understood that the words which have been used are words of description rather than limitation and that changes may be made within the purview of the appended claims without departing from the true scope and spirit of the invention in its broader aspects.

I claim:
1. An apparatus for sensing a liquid comprising:
means for generating baseband probe pulses of subnanosecond duration;
transition means coupled to said probe pulse generator means for converting a coaxial transmission line to a single wire transmission line, said single wire transmission line extending substantially perpendicularly to the surface of said liquid and extending therethrough, said wire providing a means for conducting said probe pulse to said liquid surface and for conducting reflections of said probe pulse from said liquid surface to said transition means;
coarse level increment generator means for producing pulses at a periodic rate in response to a probe pulse coupled from said probe pulse generator means, said periodic pulses defining a sequence of predetermined time intervals within which each time interval is representative of a coarse level increment for said liquid level measurement;

coarse level increment selector means for providing a selector pulse representative of one of said coarse range increments, one selector pulse generated for each probe pulse generated by said probe pulse generator means with each of said selector pulses representative of a predetermined coarse level increment;

gating means, having input terminals coupled to said coarse level increment generator means and to said coarse level increment selector means, for providing a trigger pulse at an output terminal when one of said periodic pulses and said selector pulse are simultaneously coupled to said input terminal; and fine level readout means, having a first input terminal coupled to said transition means to receive said reflected probe pulse and a second input terminal coupled to said output terminal of said gating means, for determining a fine level within the one of said coarse level increments selected by said coarse level increment selector in response to said trigger pulse coupled from said gating means and said reflected probe pulse coupled from said transition means.

2. An apparatus for sensing a liquid in accordance with claim 1 wherein said coarse level increment selector means comprises:

function generator means, coupled to said probe pulse generator means, for providing functions, one for each of said pulses of said probe pulse generator means, each of which achieves a predetermined amplitude level after a predetermined delay, said delay being of different duration for each function with the difference in said delay between succeeding pulses being approximately one coarse level increment;

coarse level trigger means for providing trigger pulses;

coarse level scanner means, coupled to said coarse level trigger means and to said function generator means, for providing switching codes to said function generator means, said switching codes being altered in response to said trigger pulses of said coarse level trigger whereby said function generator means is caused to switch from one of said functions to another; and selector pulse generator means coupled to said function generator and to said gating means for generating said selector pulse when said function achieves said predetermined amplitude level.

3. An apparatus for sensing a liquid in accordance with claim 2 wherein said coarse level trigger means contains a first input, a second input and an output, said output coupled to said coarse level scanning means and said apparatus further including a clocking means for generating clocking pulses, said probe pulse generator means responsive to said clocking pulses and said clocking pulses coupled to said first input of said coarse level trigger means whereby in the absence of a signal at said second input of said coarse level trigger means, a trigger pulse is generated at said output of said coarse level trigger means responsive to each clock pulse of said clocking means.

4. An apparatus for sensing a liquid in accordance with claim 2 wherein said function generator comprises:

means, coupled to said probe pulse generator means, for generating a step function in response to said probe pulse; and means, coupled to said generator means and to said select pulse generator, for selecting a function from a plurality of functions each of which achieves a predetermined level, which triggers said select pulse generator, at a given time delay following the generation of said probe pulse by said probe pulse generator means, said functions sequentially selected with the difference between said given time delays for adjacent selected functions corresponding to said coarse level increment.

5. An apparatus for sensing a liquid in accordance with claim 2 further including a system lock-up means, said lock-up means coupled to said fine level readout means and to said secod input of said trigger of said coarse level selector means, said lock-up means providing a signal at said second input of said trigger means when fine level readout means has determined the fine level of said liquid thereby preventing said trigger from changing state with succeeding clock pulses.

6. An apparatus for sensing a liquid in accordance with claim 1 wherein said fine level readout means comprises:

incident wave short pulse generator means coupled to said output of said coarse level readout means, for generating a subnanosecond pulse responsive to said signal at said output of said coarse level readout means;

reflected wave short pulse generator means, for generating a subnanosecond pulse responsive to said reflected pulses of said probe pulse; and fine level indicator means, having a first input and a second input, coupled to said incident wave short pulse generator means at said first input and coupled to said reflected wave short pulse generator means at said second input, for processing said short pulse of said incident wave short pulse generator and said short pulse of said reflected wave short pulse generator to determine the fine level within said designated coarse level increment of said liquid contained in said tank.

7. An apparatus for sensing a liquid in accordance with claim 6 wherein said fine level indicator comprises:

a transmission line, the electrical length of which is equal to one coarse level increment, having a first input and a second input, said first input coupled to said incident wave short pulse generator, and said second input coupled to said reflected wave short pulse generator;

a plurality of taps on said transmission line the electrical spacing of which is equal to said fine level increment; and fine level detector means coupled to each of said taps for determining and indicating the coincidence of said short pulse of said incident wave short pulse generator and said short pulse of said reflected wave short pulse generator at said taps, the tap at which said coincidence occurs determining the fine level of said liquid.

8. An apparatus for sensing a liquid in accordance with claim 1 further including:

liquid identification processor means for processing said coupled probe pulse and said reflected pulse of said probe pulse to determine the dielectric constant of said liquid; and switching means, having a first position and a second position, coupled to said probe pulse generator means, to said transition means to said liquid level processor means and to said liquid identification processor means, for switchably coupling said probe pulse generator and said transition means to said liquid level processor when said switching means is in said first position and to said liquid identification processor when said switching means is in said second position.

9. An apparatus for sensing a liquid in accordance with claim 1 further including a liquid identification processor means, having a first input and a second input, said first input coupled to said probe pulse generator means and said second input coupled to said transition means whereby signals representative of said probe pulse and said reflected pulse of said probe pulse are coupled to said liquid identification processor means for the determination of the relative amplitudes of said incident and reflected signals from which said liquid is identified.

10. A method for determining the level of a contained liquid comprising the steps of:

exciting a first transmission line, immersed in said liquid, with a probe pulse of subnanosecond duration;

generating a pulse, triggered by said probe pulse, to establish a coarse level increment;

propagating said probe pulse and a reflection of said probe pulse, produced at said level of said contained liquid, along said first transmission line, to a level processor;

triggering a first short pulse generator with said coarse level pulse;

triggering a second short pulse generator with said reflected probe pulse;

coupling said first and second short pulses to opposite ends of a second transmission line;

determining the location along said second transmission line at which said first and second short pulses coalesce, thereby determining the fine level of said contained liquid; and displaying a visual indication of said level of said contained liquid.

* * * * *